United States Patent [19]

Hase

[11] 4,001,717

[45] Jan. 4, 1977

[54] PULSE-FIRING POWER OSCILLATOR

[76] Inventor: Alfred Max Hase, 6 Manorwood Road, Scarborough, Ontario, Canada

[22] Filed: May 30, 1975

[21] Appl. No.: 582,199

[30] Foreign Application Priority Data

Feb. 7, 1975 Canada ............................. 219624

[52] U.S. Cl. ............................. 331/55; 307/247 R; 321/2; 321/49; 331/56; 331/113 A; 331/172; 331/177 R
[51] Int. Cl.² ......................................... H03K 3/30
[58] Field of Search ............ 331/47, 55, 56, 113 R, 331/113 A, 172, 173, 177 R; 321/44, 49, 2; 307/247 R, 252 R, 252 K, 252 M, 252 Q, 282

[56] References Cited
UNITED STATES PATENTS

| | | | |
|---|---|---|---|
| 3,026,484 | 3/1962 | Bennett et al. .................. | 331/56 X |
| 3,136,957 | 6/1964 | Putkovich et al. ............... | 331/56 X |
| 3,147,406 | 9/1964 | Kotas ......................... | 331/113 A X |
| 3,328,669 | 6/1967 | Ahmed et al. ............. | 307/252 M X |
| 3,646,578 | 2/1972 | Gregory ........................... | 331/113 A X |
| 3,875,493 | 4/1975 | Kunzinger et al. ................ | 321/2 X |

*Primary Examiner*—Siegfried H. Grimm
*Attorney, Agent, or Firm*—Donald E. Hewson

[57] ABSTRACT

A pulse-firing power oscillator has an iron core with a primary winding on the core and as many secondary windings as there are firing pulses to be sequentially produced in a series of pulses, with a half-wave rectifier in series with each secondary winding. A symmetrical circuit comprising back-to-back transistors is connected across the primary winding in such a manner that the base bias voltage of a transistor connected to one end of the primary winding is derived from the other end of the primary winding. A DC voltage is imposed between a center-tap on the primary winding and the common connection between the transistors which is furthest away from the center-tap — i.e., further away from the center-tap than the base of each of the biased transistors. The oscillator is self starting, and when it is free running its frequency is voltage dependent, although broadly determined by the design of the pulse transformer including the cross-section of the core and the number of primary turns thereon. The frequency of the oscillator may be slaved to the frequency of another power source, while the output of the oscillator remains a function of the oscillator design without regard to poor wave shape or voltage fluctuations of the other power source; by forcing a minority hysteresis on the core by connecting an auxiliary independent primary winding to the other power source, or by inserting signals derived from it into the oscillator.

10 Claims, 9 Drawing Figures

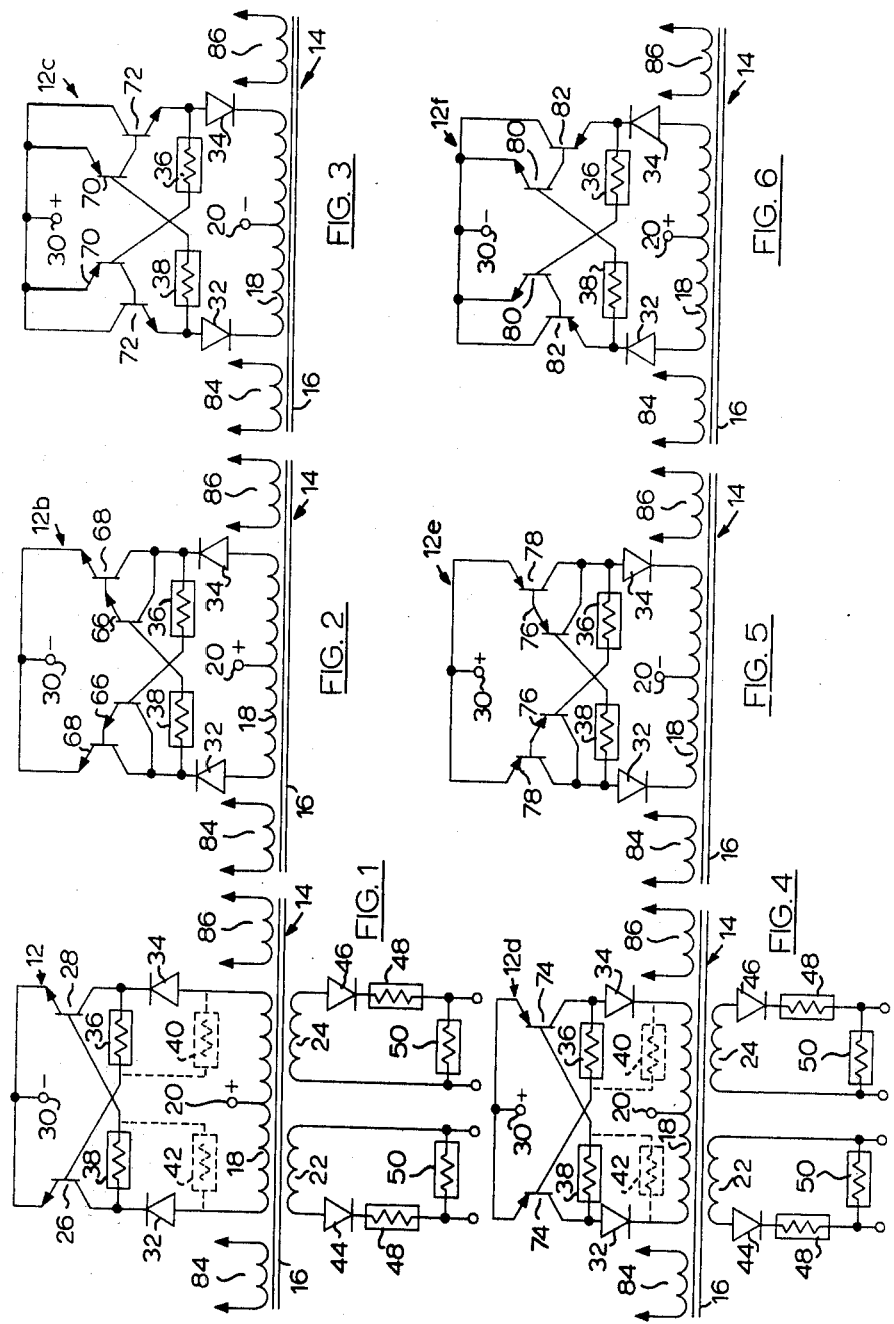

PULSE-FIRING POWER OSCILLATOR

FIELD OF THE INVENTION

This invention relates to a pulse-firing power oscillator which produces a series of sequential firing pulses for SCR's which are being used in inverter and other power conversion circuits. In particular, this invention teaches a pulse-firing power oscillator which may be free running, in which case the frequency is voltage dependent upon the impressed DC input voltage of the oscillator; or which may be synchronized to a commercial power source or other oscillators or frequency sources so as to provide a controlled output frequency of the oscillator.

BACKGROUND OF THE INVENTION

There is becoming an ever increasing demand for very high quality alternating current power, sometimes in very high power ratings, for such purposes as telephony and telecommunications, computers, etc. Very often, the quality of the voltage or power wave form of power derived from an ordinary commercial power source such as a local hydro-electric power authority or power generation company, is so poor as to create difficulties for the user; and such commercial power sources are likely to undergo voltage swings as other users come on or off the line. In any circumstances where a device is operating which is handling data at very high speeds, such as a computer, such poor quality commercial power may be intolerable. In such cases, elaborate power supply arrangements may have to be made, including the use of inverter circuits with ferroresonant voltage regulators in their output. Inverter circuits of the sort which may be particularly useful are taught in applicant's co-pending application Ser. No. 210,373 filed on Sept. 30, 1974; and a particularly suitable ferroresonant voltage regulator is taught in applicant's U.S. Pat. No. 3,824,449 issued July 16, 1974. In any event, it has very often been necessary to provide such power supply circuitry as mentioned above. Normally when an SCR circuit is being used, the gates of the SCR's are fired from a pulse-firing power oscillator which produces a series of sequential firing pulses for firing each of the SCR's in series. It may be that several SCR's will be fired at one time, but in any event at least two pulses are provided from the output of the oscillator for each cycle thereof, so as to alternately fire each of a pair of SCR's in known fashion. Usually in the past, the oscillators which have been used to control the firing of the SCR's by providing the firing pulses therefor have been uni-junction relaxation oscillators, transistor/IC hybrid oscillators, Schmitt triggers, tuning fork controlled oscillators, crystal controlled oscillators, blocking oscillators, etc.

However, difficulties which are inherent with the use of such oscillators as enumerated above include the requirement for very elaborate electronic circuitry to adapt the oscillators to SCR-firing circuitry. Even more elaborate circuitry is required, usually without success, to phase lock a plurality of SCR-type inverters in parallel, or to synchronize one or more SCR-type inverters to a commercial power line for frequency synchronization. In addition, most of the types of oscillators noted above are subject to RF interference, so that in the presence of RF signals the operation of the oscillator may be effected.

The present invention provides a pulse-firing power oscillator which, when free running, is self-starting and has voltage dependent frequency output. That is, the pulse-firing power oscillator of this invention, when free running, operates in a given frequency range which is predetermined by the design of the pulse transformer discussed in greater detail hereafter, but the precise output frequency of the oscillator is dependent upon the impressed DC voltage across it. The oscillator may comprise a number of different types of solid state components, usually transistors although integrated circuits, uni-junction transistors, SCR's, etc. may be used. The present pulse-firing power oscillator comprises a pulse transformer having an iron core, with a centre-tapped primary winding thereon and as many secondary windings as there are firing pulses to be sequentially produced in a series of pulses, with a halfwave rectifier in series with each secondary winding. At least a pair of back-to-back transistors are provided in a symmetrical circuit with one transistor connected at each end of the primary winding of the pulse transformer, the base bias voltage for that transistor being provided from the other end of the primary winding. A DC voltage is impressed across the circuit between the centre-tap of the primary winding and a common connection between the transistors which is further away from the primary winding than the bases of the transistors which are biased therefrom.

Because the oscillator frequency, when free running, is strictly dependent on the impressed DC input voltage, and the oscillator operates at relatively high power levels to produce output pulses capable of satisfying SCR gating characteristics, the oscillator output is immune to the usual RF interference normally found in power conversion circuitry.

It is sometimes necessary to run several inverters in parallel, or to synchronize one or more parallel-connected inverters to a source of commercial power for frequency standardization purposes. The reasons may be, in the case of parallel operation of inverters, the requirement for more power than a single inverter can supply; and in the case of synchronization of an inverter to a commercial power supply, so as to provide a clock synchronized to the commercial power system for time-accuracy purposes such as clocks. The latter requirements come from the fact that over a given period of time, commercial power frequencies are standardized so that a given number of cycles occurs in the period of, say, one month; and this may be important for billing or time-base purposes.

In any event, the pulse-firing power oscillator of the present invention may be easily synchronized to a commercial power line by utilizing a separate, auxiliary primary winding on the core of the pulse transformer. The auxiliary winding may be connected to the commercial power line and the frequency of the oscillator will become slaved to the commercial power line even though the power consumption of the oscillator from the commercial power line may be very low. This comes as a result of a forced minority hysteresis on the hysteresis characteristic of the core of the pulse transformer, as discussed in greater detail hereafter. Of course, through the use of auxiliary independent primary windings, a number of oscillators according to this invention may be operated in parallel so that the SCR-type inverters which they control will operate in parallel.

The pulse-firing power oscillator of the present invention may also be synchronized to another power source by inserting a synchronization signal derived therefrom to the oscillator circuitry — usually, across the base-emitter junction of one or more of the switching transistors. The synchronization signal itself may be isolated or pre-conditioned through suitable wave-shaping, filter or isolating circuits.

Thus, pulse-firing power oscillators of the present invention may be connected with several identical oscillators in parallel for purposes of circuit redundancy with parallel-operated inverters. Also, any oscillator according to this invention may be frequency slaved to any frequency source having a cyclical output, regardless of its precise waveform; so that oscillators may be synchronized to extremely high accuracy frequency sources such as quartz crystal or atomic oscillators. Alternatively, pulse-firing power oscillators of the present invention may be feedback loop controlled, by sampling the oscillator frequency and by applying error correction through appropriate circuit means.

BRIEF SUMMARY OF THE INVENTION

This invention provides a pulse-firing power oscillator for use with SCR-type inverter and other power conversion circuits, which oscillator may be operated either as a free running oscillator or in parallel with other oscillators or in synchronism with a commercial power line.

It is a feature of this invention that when the pulse-firing power oscillator is free running, its frequency is voltage dependent within the range of operating frequency for which it is intended to be operated, and is dependent upon the impressed DC voltage.

Another feature of the present invention is that when the pulse-firing power oscillator is first connected to a commercial power line, there are no abrupt phase changes or frequency changes of the operation of the oscillator, but rather that it has a slow walk-in time during which the phase is locked to the commercial power line and the frequency of the oscillator is brought into synchronism with the commercial power line.

Yet another feature of this invention is that the pulse-firing power oscillator may be operated in parallel with other similar oscillators or frequency standards.

Still another feature of this invention is that the pulse-firing power oscillator according hereto is substantially free and independent of RF interference.

BRIEF DESCRIPTION OF THE DRAWINGS

These and other features and objects of the invention are discussed in greater detail hereafter, in association with the accompanying drawings, in which:

FIG. 1 is a basic circuit of a pulse-firing power oscillator according to this invention, using NPN-type transistors;

FIG. 2 is a circuit similar to FIG. 1 using a cascade or Darlington configuration;

FIG. 3 shows a flip-flop circuit configuration;

FIGS. 4, 5 and 6 are the PNP equivalent circuits of FIGS. 1, 2 and 3 respectively;

DESCRIPTION OF THE PREFERRED EMBODIMENTS

Figure 7:
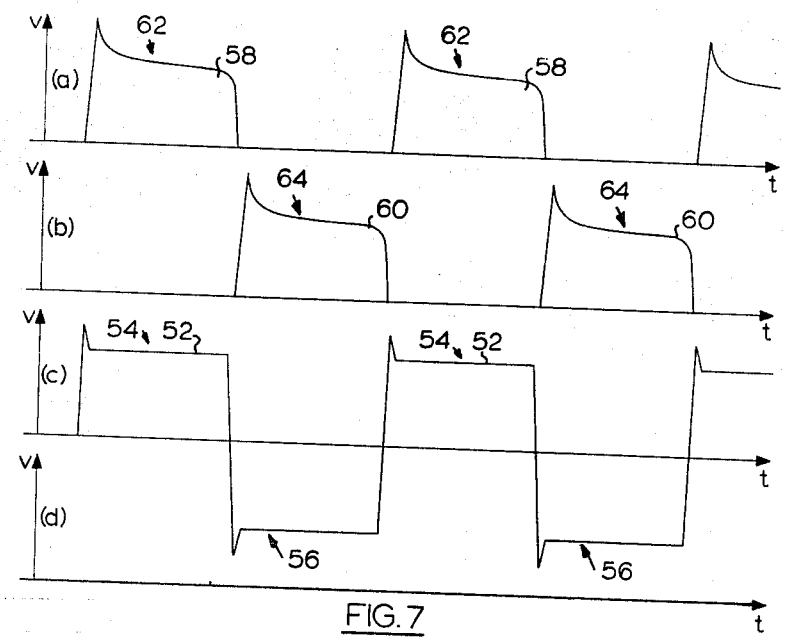
FIG. 7 shows typical secondary and primary output characteristics of an oscillator of any of FIGS. 1 to 6.

FIGS. 1 to 6 show basic variations of a basic pulse-firing power oscillator according to this invention, with a single, Darlington cascade or flip-flop transistor arrangement on each side of a symmetrical oscillator circuit, for each of NPN and PNP types. Of course, as noted above, the transistors per se may be replaced by uni-junction transistors, integrated circuits, hybrid circuits, SCR's, etc.

In any event, the basic pulse-firing power oscillator according to this invention, and as illustrated in any one of FIGS. 1 to 6, comprises an iron core — which, of course, has a hysteresis characteristic — with a centre-tapped primary winding and as many secondary windings on the core as there are firing pulses to be sequentially produced in a series of pulses, together with a half-wave rectifier in series with each secondary winding. The symmetrical circuit includes at least a pair of switchable transistors (or such other means as discussed above) each of which transistors is connected other than at its base to one end of the primary winding so that the pair of transistors is arranged in back-to-back fashion. The base of each of the pair of transistors is connected so that the base bias voltage for a transistor which is connected to one end of the primary winding is derived from the other end of the primary winding. A source of direct current voltage is connected between the centre-tap of the primary winding of the pulse transformer, and a common connection between the transistors, which common connection is further away from the centre-tap than the bases of the transistors.

Turning now to FIG. 1, there is shown a basic oscillator circuit using single NPN transistors on each side of the symmetrical oscillator. Thus, circuit 12 includes a pulse transformer 14 having an iron core 16, primary winding 18 with centre-tap 20, and a pair of secondary windings 22 and 24. A pair of NPN transistors 26 and 28 is connected to the primary winding 18. In this case, the collectors of transistors 26 and 28 are connected to the left and right hand ends of the primary winding 18 respectively; and the emitters of transistors 26 and 28 are connected together at 30. A DC voltage is imposed on the circuit between the centre-tap 20 and point 30, with the positive side of the DC voltage source being connected to centre-tap 20.

The collectors of transistors 26 and 28 are connected to the primary winding 18 through diodes 32 and 34; but the diodes 32 and 34 are not absolutely necessary although they improve the performance of the oscillator circuit as discussed in greater detail hereafter.

The base of transistor 26 — whose collector is connected to the left hand end of primary winding 18 — is connected to the right hand end of the primary winding 18, through a bias resistor 36. Likewise, the base of transistor 28 is connected through resistor 38 to the left hand end of the primary winding 18 of the pulse transformer 14. An additional pair of resistors 40 and 42 may be connected across diode 34 and resistor 36 in the case of resistor 40, and across diode 32 and resistor 38 in the case of resistor 42, in a further refinement of the circuit of FIG. 1 where the operating characteristics of the oscillator would be enhanced by making such circuit connections.

Secondary windings 22 and 24 are in series with diodes 44 and 46 respectively, each of which is connected to its respective secondary winding in a manner so that during each half cycle of operation of the oscillator on the primary side of the pulse transformer 14, one or the other of the secondary windings 22 and 24 is conductive. Pulse shaping networks comprising resistors 48 and 50 may also be connected to each of the secondary windings 22 and 24.

It should be noted that the number of secondary windings may be greater than two, there being in any event as many secondary windings as there are firing pulses to be sequentially produced in a series of pulses for firing the SCR's of an SCR-type inverter or other power conversion circuit. Thus, there may be two or three pairs of secondary windings where one of each of the pairs of secondary windings is conductive during one or the other half-cycle of voltage on the primary winding of the pulse transformer 14; or they may be phase displaced.

The operation of the oscillator of FIG. 1, as so far described, is as follows:

Suppose that the source of direct current voltage is not connected between centre-tap 20 and point 30. At that time, the oscillator is quiescent, i.e. non-operating. When the direct current voltage source is connected to the centre-tap 20 and point 30, one or the other of transistors 26 and 28 will become conductive slightly faster than the other of the transistors. In the event, when one of the transistors becomes conductive, the period of time for which it will be conductive is a function of the DC voltage between centre-tap 20 and point 30, the value of its base bias resistor, the number of turns and the resistance of the primary winding 18 and the cross-section of the transformer 14. That period of time may be, for example, 1/120 of a second, more or less (within 5 or 10%). After that period of time, the other of the transistors becomes conductive, and the direction of voltage rise across the primary winding 18 reverses. Oscillation is thereby established.

With the DC voltage being imposed on the centre-tap 20 and at point 30, the sides of the DC voltage source are the furthest away from each other that they can be in the primary side of the oscillator circuit. A strong base bias voltage on the transistors is thereby assured, with substantially instantaneous turn-off and extinguishing of the conduction of the transistor on the other side. The inclusion of diodes 32 and 34 is beneficial in that feedback to the non-conducting transistor is precluded.

Referring to FIG. 7, there is shown in curve (c) a square wave voltage characteristic designated 52 having a positive going pulse 54 and a negative going pulse 56 in the respective halves of a cycle thereof. Curve (c) is intended to illustrate the nature of the voltage across the primary winding 18 of the pulse transformer 14 while the oscillator is in operation. Curves (a) and (b) of FIG. 7 show the voltage characteristics on two secondary windings of the oscillator, as designated by curve segments 58 and 60 which are repeated in time. Thus, during the positive half of the primary voltage cycle as shown in curve (c) of FIG. 7, the secondary voltage on one of the two secondary coils 22 and 24 is such as shown at 58, with pulse 62; and in the negative half of the primary cycle the other secondary coil has a substantially identical voltage characteristic 60 having pulse 64. [As an example of the requirements of present day SCR-type inverters and other power conversion devices, the rise time of pulses 62 and 64 may be more than one $\mu$ sec/amp, and the average holding current during the total pulse width may be in the order of 300 mA.]

In order to vary the frequency of the oscillator circuit 12 when it is free running as discussed so far, it is merely necessary to vary the DC voltage impressed between the centre-tap 20 and point 30. Of course, the DC voltage source would be, itself, regulated; and it may be either of the constant voltage or constant current type in order to obtain closely regulated frequency accuracy.

Before proceeding with further discussion of FIG. 1 and the use of auxiliary independent primary windings on the core 16 of the pulse transformer 14, brief reference will be made to FIGS. 2 to 6. Thus, FIG. 2 shows an essentially equivalent circuit to that of FIG. 1, where the oscillator circuit 12b includes back-to-back pairs of transistors 66 and 68 which are connected in Darlington cascade configurations. The bias arrangement to transistor 66 is substantially identical to the bias arrangement shown in FIG. 1 for transistors 26 and 28. Similarly, FIG. 3 shows back-to-back arrangements of complementary pairs of transistors 70 and 72 in flip-flop configuration. Of course, in FIG. 3, the direction of the DC voltage source is reversed because of the use of PNP transistor 70 with NPN transistor 72; and the direction of diodes 32 and 34 is likewise reversed.

FIGS. 4, 5 and 6 show the precise PNP equivalents of the NPN circuits of FIGS. 1, 2 and 3, respectively. Thus, the circuit 12d of FIG. 4 shows a pair of PNP transistors 74 in back-to-back relationship, in the same manner as in FIG. 1, but with the DC voltage connections reversed and the direction of diodes 32 and 34 reversed. Likewise, FIG. 5 illustrates a Darlington cascade of pairs of transistors 76 and 78 on each side of the symmetrical circuit; and FIG. 6 shows a flip-flop complementary pair 80 and 82 on each side of the symmetrical circuit, with the DC voltage source connected in the reverse direction to that of circuit 12c in FIG. 3. Each circuit provides a strong base bias of the transistor connected to the other end of the primary winding of the pulse transformer 14 to the end from which the base bias voltage is derived. Thus, instant turn-on and extinguishing of the other side of the oscillator circuits is achieved; and in all cases the oscillator circuits are not greatly susceptible to RF interference. The use of diodes 32 and 34 in each of the circuits of FIGS. 1 to 6 precludes feedback from the primary winding to the opposite side, during each half cycle of oscillator operation.

The rise time of the primary voltage as shown by curve 52 in FIG. 7c, and the gain of the transistors used, determine the quality of the firing pulses 62 and 64 from the secondary coils. In addition, as noted, the nominal frequency of operation of any of the oscillator circuits of FIGS. 1 to 6 is determined broadly as a function of the transformer design and the applied DC voltage, within 5 or 10% in the usual case, when the oscillators are free running. The precise frequency of operation is a function of the regulating accuracy of the DC voltage impressed between the centre-tap 20 and point 30, in each case.

It should also be noted that when a pulse-firing power oscillator according to this invention is free-running with a constant load, the DC power supply can be set to constant current operation, thereby accommodating any temperature or other drift of the circuit components. In those circumstances, very reliable and constant frequency output of the oscillator may be maintained.

It has been previously stated that pulse-firing power oscillators according to this invention may also be slaved to a master oscillator. In particular, they may be synchronized to a source of commercial power for such purposes as providing time-base accuracy such as clocks, or other real-time-dependent factors and considerations. It thus becomes desirable to provide means whereby a pulse-firing power oscillator according to this invention may be connected to other oscillators for parallel operation of inverters or other power conversion circuits, to a master oscillator or to a source of ordinarily available alternating current such as the commercial power source. Such means are provided by placing on the core 16 of the pulse transformer 14 one or more additional auxiliary independent primary windings, such as those designated at 84 and 86 in FIGS. 1 to 6. In each case, therefore, either of auxiliary windings 84 and 86 is adapted for connection to another oscillator, a master oscillator or other source of pulsed DC or alternating current power.

The oscillator may also be parallel operated or synchronized to another oscillator, master oscillator or other source of pulsed DC or alternating current power by inserting signal derived from such other sources to the base drive of one or both of the transistors, across the base-emitter junctions thereof, or from a bias winding of a pulse firing oscillator transformer. Thus, a signal may be inserted at the base of transistor 26 of FIG. 1, across resistor 36 or across the base-emitter junction of the transistor 26, or similarly with respect to transistor 28 or in symmetry on both transistors. Likewise, the DC input source may itself be regulated by frequency dependent means which is slaved to another frequency source, thereby achieving synchronization of the oscillator thereto.

The other frequency source to which an oscillator according to this invention may be slaved can be a commercial power source, another oscillator, or any frequency source having a cyclical output; e.g. the source may be continuous alternating current or a series of pulses. Thus, it is possible to obtain pulse-firing power oscillator output having extremely high frequency stability and accuracy by slaving the oscillator to a source such as a quartz crystal or atomic oscillator.

When an auxiliary independent primary winding 84 is connected to another oscillator or an ordinarily available source of alternating current such as a commercial power source, the oscillator changes its mode of operation from free running to that of a slaved oscillator in a frequency sense. Thus, the commercial power source, for example, will become the master oscillator and will set the frequency of the pulse-firing power oscillator according to this invention. However, it should be noted that even in such circumstances, the power derived from the commercial power source or master oscillator is usually in the order of 10% of the power consumed by the oscillator, the remaining 90% coming from the DC power source.

Figure 8:
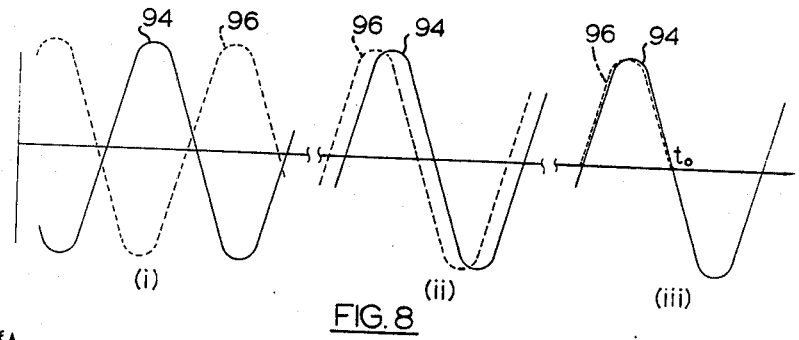
FIG. 8 illustrates a slow walk-in characteristic as an oscillator according to this invention is brought into synchronization with a master oscillator or commercial power line.

Turning now to FIG. 8, there is shown the manner in which a pulse-firing power oscillator according to this invention is brought into sychronism with a master oscillator such as a commercial power source. Curve 94 is the commercial power source operating at commercial power frequency — and while the curve is shown to be substantially sinusoidal, it may in fact have less than an ideal wave form so as to be unsuitable for use with certain highly critical loads such as computers. Indeed, the synchronizing power source 94 needs only to have an accurate time base, so that it may be used as a master. Curve 96 is the output of an SCR-type inverter or other power conversion circuit, whose frequency of operation is determined by the frequency of the pulse-firing power oscillator which drives the SCR's. FIG. 8 is broken into three segments of time designated (i), (ii) and (iii) respectively; where time segment (i) shows the commercial power 94 to be approximately 180° out of phase with the inverter power 96, time segment (ii) shows the inverter power 96 nearly in phase with the commercial power 94, and time segment (iii) shows latching of the inverter power 96 to the commercial power 94 at a time $t_o$, at which time both the inverter power and the commercial power are locked in phase.

Figure 9:
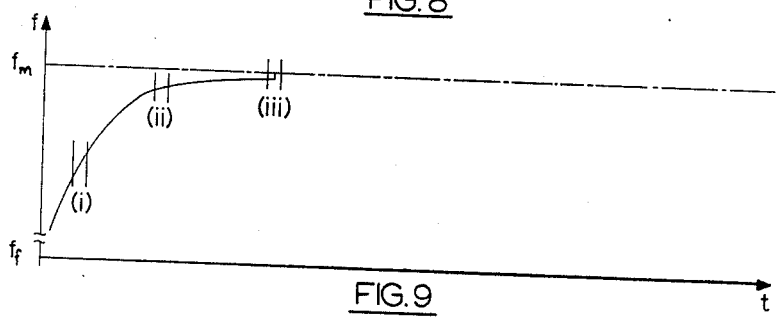
FIG. 9 shows a typical frequency shift characteristic of an oscillator according to this invention as it goes from a free running mode of operation into synchronism with a master oscillator.

FIG. 9 shows the characteristic of the change of frequency of the oscillator from the free running frequency $f_f$ to the commercial or master power frequency $f_m$, and indicates where time segments (i), (ii) and (iii) may occur. It is important to note that the frequency walk-in performance characteristic illustrated in FIG. 10 asymptotically approaches the commercial power or master frequency, with no violent shifts or swings of frequency, no phase upsets or reversals, and no overshoot. Thus, when the inverter power latches to the commercial power, it is phase-locked, and cannot be unlatched without removal of the commercial or master frequency source. In that instance, the walk-out characteristic is asymptotic to the free-running frequency.

All of the above is brought about by virtue of the fact that changes of permeability in the core 16 of the pulse transformer 14 of a pulse-firing power oscillator according to this invention are relatively slow. Therefore, a soft walk-in of the free running oscillator to synchronization with a commercial power source or a master oscillator is possible, and may be programmed to take as little as one portion of one cycle or up to several minutes. Thus, the hysteresis characteristic of the core 16 of the pulse transformer 14 is guided by the external power source because of the forced minority hysteresis; but because the permeability changes of the core are slow-acting, it takes a period of time for the frequency and/or phase of the oscillator and thereby the SCR-type inverter to shift to synchronism with the master oscillator — even though the pulse-firing power oscillator may derive perhaps only about 10% of its power from the master oscillator. The speed of the walk-in may be varied depending on the amount of power derived from the auxiliary frequency source.

It follows particularly from the above, and also from the discussion of FIG. 7 with respect to fast pulse rise times, that the core 16 of the pulse transformer 14 is ideally a non-saturating iron core; and is therefore capable of having its hysteresis characteristic guided by the external power source because of forced minority hysteresis.

Likewise, the walk-out of the pulse-firing power oscillator according to this invention away from synchronism with a master oscillator or commercial power source — and thereby of the SCR-type inverter or other power conversion circuit — in the event of breakdown or disconnection of the oscillator from the other system, is very slow. In the same manner, several SCR-type inverters or other power conversion circuits may be operated in parallel by operating their pulse-firing power oscillators in parallel. Also, in the same manner, using a second auxiliary independent primary winding on the core 16 of a pulse-firing power oscillator according to this invention, additional alternating current devices having running oscillators may be connected so that all of the devices operate in synchronism without upsetting or effecting the operation of, say, a master oscillator.

Of course, the operation of the pulse-firing power oscillator according to this invention is constant whether or not the oscillator is connected by an auxiliary independent primry winding to another alternating current device or source, except that the frequency of operation of the oscillator is free running if the oscillator is completely independent of any other alternating current device or source whereas the oscillator is forced to operate in synchronism with a master or other source of alternating current power when one or more of its auxiliary independent primary windings are connected thereto. As noted, the oscillator may also be synchronized by inserting signals to one or more of the transistors.

It will be noted, therefore, that a three-phase oscillator having three phases of output which are each 120 electrical degrees displaced from the other phases may be obtained by inter-connecting three single-phase oscillators through paralleling coils or other base-drive inter-connecting circuits and 60/120 electrical degree time constant components or circuits. A 120 electrical degree firing system can be achieved by using one oscillator according to this invention to drive a ring counter; with the output of the ring counter being arranged to trigger three pulse firing circuits which are displaced 120 electrical degrees from one another. In like manner, a three-phase oscillator may be synchronized and paralleled to a three-phase commercial power line or other three-phase alternating current devices; or by series connecting the auxiliary windings of all the oscillators and synchronizing them to one phase with suitable phase shifting in the oscillator outputs.

There has been described above a pulse-firing power oscillator for use with SCR-type inverters or other power conversion circuits, where the oscillator may be free running or synchronized to a master oscillator or source of commercial power. The change of mode of operation from free running to synchronism with another alternating current device or source of power of the oscillator is slow-acting so that no violent or abrupt changes of frequency or phase of the output of an SCR-type inverter may occur when its oscillator is connected to a master oscillator or other alternating current device. The pulse-firing power oscillator of the present invention, whether it is operated as a free running oscillator or in synchronism with other alternating current devices, is substantially free of RF interference. Pulse-firing power oscillators according to this invention may be provided having high holding current capabilities and having very fast rise times. A plurality of oscillators according to this invention may be operated in parallel, or they may be connected through suitable time constant and paralleling circuitry into multi-phase operation.

It has been noted that devices other than transistors per se may be used in the oscillator circuitry, in the well known manner. For example, one or more diodes or a zener diode may be placed in series with either or both of the base drive resistors 36 and 38 so as to momentarily offset the base drive of the transistor which is becoming conductive, thereby improving the switch-through gain of the transistor. Further, the precise design of the pulse transformer, the number of primary turns, its cross-section, etc. may be easily prepared in the known manner, having in mind the nominal frequency requirements and the operating characteristics of the electronic components of the pulse-firing power oscillator according to this invention. Other alternative arrangements of the circuits of FIGS. 1 to 6 may include a bridge circuit arranged to have two PNP arms and two NPN arms in series, with the primary winding of the oscillator transformer connected between the PNP/NPN series points; a circuit connected with separate base-emitter bias windings on the core; or a reverse biased pair of transistors with current limiting. The oscillator may be prepared for synchronization purposes only, using an ordinary transformer with the secondary windings driving pulse-shaping transformers having appropriate output circuitry. The output of an oscillator according to this invention may be made sinusoidal by using appropriate LC or other wave shaping circuitry in the secondary side of the transformer, so that the oscillator may be used as a stable ringing generator in telephone circuits. Other changes, modifications and amendments to the circuits may be made without effecting the basic operation of the pulse-firing power oscillator according to this invention, its ability to be free running or synchronized, and its soft walk-in, walk-out characteristics, without departing from the spirit and scope of the appended claims.

The embodiments of the invention in which an exclusive property or privilege is claimed are defined as follows:

1. A pulse firing power oscillator for producing a series of sequential firing pulses for SCR's being used in inverters and the like, where said oscillator comprises:
   a non-saturating iron core having hysteresis characteristic;
   a primary winding on said core;
   as many secondary windings on said core as there are firing pulses required during each 360 electrical degree operation of said pulse-firing oscillator; and
   a half-wave rectifier in series with each secondary winding;
   said primary winding having a centre-tap;
   a symmetrical circuit including at least a pair of switchable transistors, each connected other than at its base to one end of said primary winding so that said pair are in a back-to-back fashion, with the base of each of said pair of transistors being connected so that the base bias voltage for the one of said pair of transistors which is connected to one end of said primary winding is derived through a non-reactive connection from the other end of said primary winding; and
   a source of direct current voltage connected between the centre-tap of said primary winding and a common connection between said pair of switchable transistors, which common connection is further away from said centre-tap than the bases of said transistors.

2. The oscillator of claim 1, further including a first auxiliary independent primary winding on said core; where said auxiliary winding is adapted for connection to an independent frequency source.

3. The oscillator of claim 2 where said first auxiliary winding is connected to a source of ordinarily available alternating current.

4. The oscillator of claim 2 where said first auxiliary winding is connected to a further oscillator having a pulsed output.

5. The oscillator of claim 3 further including a second auxiliary independent primary winding on said core, connected to a further alternating current device.

6. The oscillator of claim 1 including a pair of diodes each connected to one end of said primary winding so as to be facing in a normally conductive direction with respect to the direct current voltage source which is connected at one side thereof to said centre-tap of said primary winding.

7. The oscillator of claim 6 further including a resistor connected between the side of each of said diodes which is remote from the end of said primary winding to which each diode is connected, and the base of the transistor that is connected through the other of said diodes to the other end of said primary winding.

8. The oscillator of claim 1 where each of said secondary windings has a diode connected in series therewith so that one each half-cycle of alternating current across said primary winding, at least one secondary winding is conductive.

9. The oscillator of claim 1, further including means to impress a signal from an independent frequency source across the base-emitter junction of at least one of said transistors.

10. The oscillator of claim 1, further including means to impress a signal from an independent frequency source on the base drive of at least one of said transistors.

* * * * *